United States Patent [19]

Shimada et al.

[11] Patent Number: 4,514,275

[45] Date of Patent: Apr. 30, 1985

[54] APPARATUS FOR PHYSICAL VAPOR DEPOSITION

[75] Inventors: Hisashi Shimada, Nagoya; Tohru Arai, Toyoake; Junji Endo, Nagoya, all of Japan

[73] Assignee: Kabushiki Kaisha Toyota Chuo Kenkyusho, Japan

[21] Appl. No.: 594,444

[22] Filed: Mar. 30, 1984

Related U.S. Application Data

[63] Continuation-in-part of Ser. No. 345,423, Feb. 3, 1982, abandoned.

[30] Foreign Application Priority Data

Feb. 12, 1981 [JP] Japan .................................. 56-20495

[51] Int. Cl.³ .............................................. C23C 15/00
[52] U.S. Cl. .................................. 204/298; 204/192 N; 204/192 EC; 118/723; 118/50.1; 118/726
[58] Field of Search ............... 204/192 R, 298, 192 N, 204/192 EC; 118/715, 733, 723, 726, 727, 50.1, 50

[56] References Cited

U.S. PATENT DOCUMENTS

| | | | |
|---|---|---|---|
| 2,960,457 | 11/1960 | Kuhlman | 118/726 X |
| 3,839,182 | 10/1974 | Sager | 204/192 R |
| 4,190,019 | 2/1980 | Hunt | 118/715 X |

FOREIGN PATENT DOCUMENTS

| | | | |
|---|---|---|---|
| 159067 | 7/1953 | Australia | 118/715 |
| 863243 | 2/1971 | Canada | 204/298 |
| 46-2165 | 5/1971 | Japan | 204/192 EC |
| 53-17583 | 2/1978 | Japan | 118/733 |
| 479258 | 2/1938 | United Kingdom . | |
| 2008156A | 5/1979 | United Kingdom . | |
| 1577728 | 10/1980 | United Kingdom . | |

Primary Examiner—John D. Smith
Assistant Examiner—Bernard F. Plantz
Attorney, Agent, or Firm—Leydig, Voit, Osann, Mayer and Holt, Ltd.

[57] ABSTRACT

An apparatus for physical vapor deposition comprising a vacuum casing one end of which is open; a sealing member provided at the opening of the casing; an electrode for physical vapor deposition, such as a target electrode or an electrode for heating evaporation, which is provided in the casing; and an exhaust hole for exhausting gases in the casing, which is provided at a predetermined wall portion of the casing. The apparatus may also be provided with a gas introducing hole and a bias electrode. The casing is integrally fitted to a body to be treated at the opening end portion thereof by means of the sealing member to form a vacuum chamber therein. This apparatus is compact and enables the surface treatment of a large or immovable body without moving the body.

13 Claims, 2 Drawing Figures

APPARATUS FOR PHYSICAL VAPOR DEPOSITION

This application is a continuation-in-part of application Ser. No. 345,243 filed Feb. 3, 1982, now abandoned.

BACKGROUND OF THE INVENTION

1. Field of the Invention:

The present invention relates to a surface treatment of a body with metals, inorganic substances or organic substances by means of physical vapor deposition, thereby to give the body weather resistance, wear resistance, corrosion resistance and functionability.

2. Description of the Prior Art:

Conventionally, the surface treatment of bodies has been extensively carried out by means of physical vapor deposition such as vacuum evaporation, sputtering, ion plating or the like, thereby to give the bodies wear resistance, weather resistance and corrosion resistance, to improve reflectivity or to give shading ability.

According to prior art methods, however, a body to be treated has to be placed into a vacuum container, which places a limit on the size of a body to be treated. Namely, for a body of a large size, a vacuum container and exhaust system of a remarkably larger size than that of the body are required. Therefore, the cost of physical vapor deposition is increased, or if the body to be treated is too large, it will even be impossible to treat the surface thereof by means of physical vapor deposition.

SUMMARY OF THE INVENTION

To overcome these disadvantages, the present inventors have noted the facts that the surface treatment to the body does not always require to be carried out over the entire surface thereof and therefore, a space, which should be kept in a vacuum condition, does not always require to be large. The present invention has been completed based on the accumulations of these conditions.

Accordingly, it is an object of the present invention to provide an apparatus for physical vapor deposition by which a large or immovable body can be treated without large equipment.

It is another object of the present invention to provide an apparatus for physical vapor deposition which enables a partial surface treatment or a surface treatment of a bottom or side surface of a body without moving the body.

It is still another object of the present invention to provide an apparatus for physical vapor deposition which is compact and simple in its construction.

It is a further object of the present invention to provide an apparatus for physical vapor deposition by which the surface treatment by means of physical vapor deposition can be carried out at an economically inexpensive cost.

It is a still further object of the present invention to provide an apparatus for physical vapor deposition in which the surface treatment itself can be observed because the casing may include a transparent part.

It is a further object of the present invention to provide an apparatus for physical vapor deposition by which it is possible to intensively bond the treated surface and a film formed thereon.

The foregoing and other objects are attained by providing an apparatus for physical vapor deposition for coating a surface to be treated of a body comprising: a casing having an opening at one end thereof; a sealing member provided at an opening end of the casing in contact with the surface to be treated, for air-tightly sealing a vacuum chamber formed by the casing and the surface to be treated; electrode means, such as a target electrode or a plurality of electrodes for heating evaporation, for physical vapor deposition, particularly sputtering provided in the vacuum chamber and connected to a power source, for emitting vapor of coating material to the surface to be treated; a bias electrode comprising a ring-shaped member, having a larger inner diameter than the diameter of said electrode means, provided in said vacuum chamber between said electrode means and the surface to be treated and connected to a power source so as to have a higher potential than the surface to be treated and the electrode means; a gas introducing hole provided at a predetermined wall portion of the casing independently of the exhaust hole for introducing a specific gas into the casing; and an exhaust hole provided at a predetermined wall portion of the casing, for exhausting gases in the casing, whereby said emitted vapor reaches said surface to be treated without being obstructed by said bias electrode.

DETAILED DESCRIPTION

Figure 1:
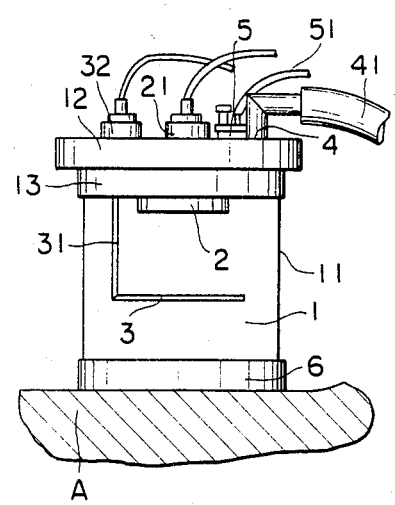
FIG. 1 is a front view showing a first embodiment of the present invention.

According to the apparatus for physical vapor deposition of this invention, the vacuum sealing member is made in contact with that portion of the body which includes a surface to be treated, to form an air-tight chamber in the casing. The chamber is defined by the inner wall of the casing and the aforesaid portion of the body to be treated. In addition, an electrode and an exhaust hole, which are necessary for physical vapor deposition, are also provided in the casing. According to this apparatus, it becomes possible to carry out a surface treatment by physical vapor deposition on bodies of a large size or even on fixed bodies. Thus, the conventional disadvantages have been overcome.

The casing of this apparatus for physical vapor deposition serves as a main body of the apparatus and it is provided with an electrode and an exhaust hole necessary for physical vapor deposition. Moreover, the casing is integrally fitted to the body to be treated to for form a vaccum chamber therein. Thus, the surface of the body also serves to form a part of the vacuum chamber. For the casing, any casing can be used if only it has a strength to withstand the atmospheric pressure (1 atm.), and it may be formed of metals, ceramics and the like. The casing may be partially or entirely made of a transparent material. This is very convenient because the surface treatment itself can be observed. The casing should be open at one thereof and have a hollow portion enough to receive electrodes and the like. The casing may by cylindrical, rectangular or of any shape.

The casing is provided with a vacuum sealing member at the opening end thereof. By means of this vacuum sealing member, the body to be treated and the casing are integrally fixed thereby to keep the interior of the casing air-tight. The vacuum sealong member is made of soft material such as rubber, silicone resin paste and the like. It is preferable that the contour of this sealing member follows that of the surface of the body to be treated. In this connection, a forming material such as silicone resin or the like is advantageously used. If the body to be treated has a substantially smooth surface, an O ring made of rubber or the like can be used. On the other hand, if the surface of the body to be treated is so rough that it is difficult to seal the surface thereof, a vacuum grease in paste form or the like can also be used.

In the casing, there is provided a target electrode for sputtering or electrodes for heating evaporation to be employed in vacuum evaporation. As these electrodes, conventional electrodes for sputtering and vacuum evaporation can be employed. In the case of vacuum evaporation, when a molten metal melted by the electrodes for heating evaporation is deposited, care should be taken so that the molten metal does not flow out.

In addition to the aforesaid electrodes a bias electrode is provided in the casing. The bias electrode serves to carry out ion plating and bias sputtering. Such ion plating and bias sputtering cause two discharges, i.e., one between the target electrode and the bias electrode for sputtering and the other between the bias electrode and the surface to be treated, for activating the coating material and ion bombarding the deposit, thereby obtaining a dense deposited layer with a strong adhesive force. The bias electrode also serves to clean the surface to be treated before sputtering and increases the adhesive force of the coating due to a discharge therebetween.

The casing requires an exhaust hole for exhausting gases in the casing. By the provision of this exhaust hole, the pressure in the interior of the casing can be reduced so that it becomes possible to carry out the physical vapor deposition. Further, in order to carry out the physical vapor deposition under a particular atmosphere, a gas introducing hole may also be provided at the casing, for introducing a specific gas into the casing.

Preferably, moreover, a fixing member such as a clamp, a magnet clamp or the like may be provided to fix the apparatus to the body to be treated.

Hereinafter, embodiments according to the present invention will be described.

In FIG. 1, there is shown a front view of an apparatus according to a first embodiment of this invention. Employing the apparatus, sputtering is carried out on one portion of the upper surface of a large-sized metal die A. This apparatus is provided with a vacuum casing 1 comprising a cylindrical transparent glass tube 11, and a metal cap 12 fitted on an upper end of the glass tube 11 through a packing 13. In this casing, a target electrode 2 is provided fixedly on the undersurface of the cap 12 at the center portion thereof. A terminal 21 of the target electrode is provided on the upper surface of the cap 12 outside the casing and connected to a power source. Further, a ring-shaped bias electrode 3, having a larger inner diameter than the diameter of the target electrode, is placed below the target electrode 2. The bias electrode 3 is supported by a supporting rod 31 hanging from the cap 12 and its terminal 32 is provided on the upper surface of the cap 12. The cap 12 of this casing 1 is also provided with an exhaust hole 4 for exhausting gases in the casing and the hole 4 is communicated with a vacuum pump through an exhaust pipe 41. The cap 12 is also provided with an independent gas introducing hole 5 to which a gas introducing pipe 51 is fitted.

A vacumm sealing member 6 is provided at a lower opening end portion of the glass tube 11, which member consists of a packing made of rubber. The vacuum sealing member 6 is air-tightly in contact with the surface of the metal die A, whereby the interiof of the casing 1 is sealed.

When carrying out the surface treatment by employing this apparatus, firstly it should be ensured that the surface to be treated of the metal die A is air-tightly sealed by the vacuum sealing member 6 fitted to the glass tube 11. Thereafter, air in the casing 1 is exhausted by a vacuum pump (not shown) through the exhaust hole 4. Then, a desired amount of a specific gas is introduced into the casing thereby to control the atmosphere in the casing 1. A predetermined voltage is applied across the bias electrode 3 and the metal die A, and across the target electrode 2 and the metal die A.

The target electrode receives positive ions and emits vapor of the target electrode material to the surface to be treated, whereby sputtering is carried out. In this case, when the target electrode is connected to a direct current power source, the target electrode should have a lower potential than the surface to be treated. When connected to an alternating current power source (supplying radio frequency for industrial use), the target electrode should have a smaller area than the opening area of the casing.

The bias electrode should have a higher potential than the surface to be treated.

Thus, the apparatus of this invention is very compact and movable. This apparatus enables the surface treatment of a large or immovable body such as a metal die of a large size, which has heretofore been difficult or impossible. Moreover, the apparatus according to the first embodiment has an advantage that the surface treatment to the body can be carried out as it is observed, since the glass tube 11 of the casing 1 in this apparatus is made of a transparent material.

As an example, there was prepared a cylindrical vacuum casing, which has the same configuration as that of the apparatus shown in FIG. 1, having no bottom portion, and which has an inner diameter of 130 mm and a length of 55 mm. By employing such a casing, sputtering was carried out on a press metal die. The metal die was sufficiently polished so that the surface thereof resulted in a mirror finished condition. The aforesaid vacuum casing was set on the surface of the metal die. Gases within the casing were exhausted up to $5 \times 10^{-5}$ Torr and thereafter, an argon gas was introduced into the vacuum casing to keep the interior thereof in an atmosphere of 0.07 Torr. Then, an etching treatment was carried out for 5 minutes in the argon atmosphere of 0.07 Torr by means of a power source supplying a current of 0.05 A and a voltage of 2 KV, wherein the metal die is given negative voltage relative to the bias electrode. After the aforesaid etching treatment, a gold coating treatment was carried out on the metal die by means of sputtering. In this case, the target electrode is given negative voltage relative to the metal die. During these treatments, the metal die was always grounded.

The conditions for the aforesaid sputtering and its results were as follows.

distance between the target and the metal die surface: 25 mm
ionization potential: DC 1.4 KV
current: 10 mA
argon pressure: 0.07 Torr
deposition time: 8 min.

thickness distribution of gold film: at center: 520 Å at points apart from the center by 60 mm: 400 Å

As another example, there was prepared an apparatus having the same construction as that the aforesaid example except that the target electrode was connected to an alternating current power source (peak to peak voltage: 1.4 KV) instead of a direct current power source and the terminal 21 was placed in an impedance matching box provided on the upper surface of the cap 12. As a result, the surface of the metal die was coated with a film of a desired thickness.

Figure 2:
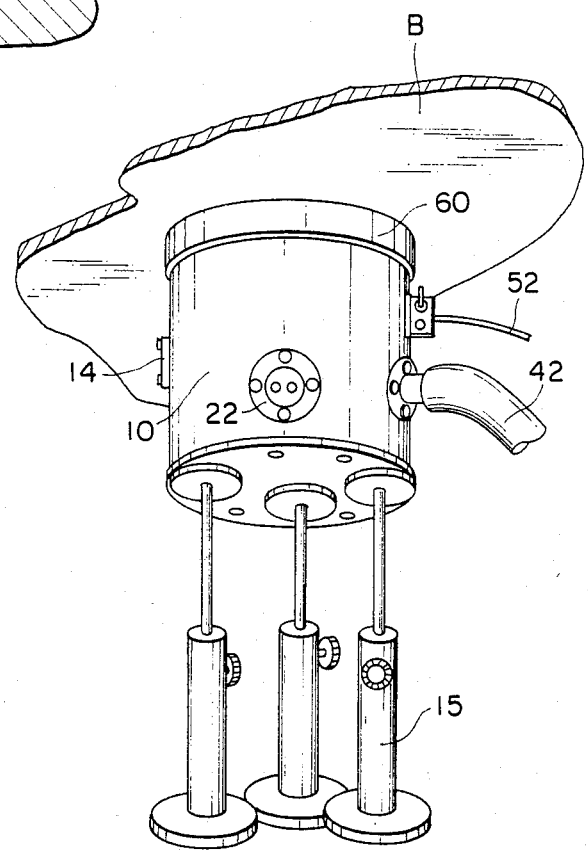
FIG. 2 is a perspective view showing a second embodiment of the present invention.

There is shown in FIG. 2 a second embodiment according to this invention. An apparatus of this embodiment is to carry out vacuum evaporation to the bottom surface of a body B, and the apparatus includes a metal casing 10 as a main body thereof. This metal casing 10 comprises a cylindrical can one end of which is open and it is provided on the sidewall thereof with terminals 22 for a pair of electrodes (not shown) for heating evaporation, a terminal for a bias electrode (not shown). an exhaust pipe 42, a gas introducing pipe 52 and a peep window 14. The pair of electrodes for heating evaporation are placed in the casing at the center thereof.

There is provided a vacuum sealing member 60 composed of a packing made of rubber at the opening end of the casing 10. There are also provided stands 15 at the lower end portion of the casing 10, for fixing the casing 10 to the bottom surface of the body B, whereby the casing 10 is pressed against the bottom surface to be treated of the body B so as to be supported thereto.

When carrying out the surface treatment to the bottom of the body B with this apparatus, the casing 10 should be fixed to the bottom surface of the body B by means of stands 15 as shown in FIG. 2. Then, air in the casing 10 is exhausted by means of the exhaust pipe 42, and a specific gas is introduced into the casing through the gas introducing pipe 52 to control the atmosphere with the casing 10. After the etching treatment by use of the bias electrode, a predetermined current is supplied to the electrode for heating evaporation from the terminal 22 to heat a filament used for evaporation, whereby a metal is evaporated and deposited to the bottom surface of the body B. For this purpose, it is possible to use a crucible containing coating metal, which is heated by electron beams through a plurality of electrodes. During this surface treatment, the state of the treatment can be observed through the peep window 14.

The electrodes used in the above embodiments may be replaced by any other known electrode for vapor deposition, for sputtering or for ion plating.

Although specific embodiments of the invention have been illustrated and described, it will be understood that various alterations may be made therein without departing the scope of the invention as defined by the appended claims.

What is claimed is:

1. An apparatus for physical vapor deposition for coating a surface to be treated of a large or immovable body comprising:
    a casing having an opening at one end thereof;
    a sealing member provided at an opening end of said casing in contact with said surface to be treated, for air-tightly sealing a vacuum chamber formed by said casing and said surface to be treated;
    electrode means for sputtering provided in said vacuum chamber and connected to a power source for emitting vapor of coating material to said surface to be treated;
    a bias electrode comprising a ring-shaped member, having a larger diameter than the diameter of said electrode means, provided in said vacuum chamber between said electrode means and said surface to be treated and connected to a power source so as to have a higher potential than said surface to be treated and said electrode means;
    an exhaust hole provided at a predetermined wall portion of said casing, for exhausting gases from said casing; and
    a gas introducing hole provided at a predetermined wall portion of said casing independently of said exhaust hole for introducing a specific gas into said casing, whereby said emitted vapor reaches said surface to be treated.

2. The apparatus according to claim 1, wherein said electrode means comprises a target electrode for receiving positive ions and emitting vapor of the target electrode material to said surface to be treated.

3. The apparatus according to claim 2, wherein said target electrode is connected to a direct current power source and has a lower potential than said surface to be treated.

4. The apparatus according to claim 2, wherein said target electrode is connected to an alternating current power source and has a smaller area than an opening area of said casing.

5. The apparatus according to claim 1, wherein said casing is transparent in at least one part thereof.

6. The apparatus according to claim 1, further comprising a fixing member for fixing said casing to said body to be treated, thereby coating a predetermined surface portion of the body.

7. The apparatus according to claim 1, wherein
    said casing comprises a cylindrical, transparent glass tube, and a metal cap fitted on an upper portion of said glass tube through an intermediate packing member, said casing being open at a lower end thereof;
    said sealing member is provided at a lower opening end of said casing in contact with the surface to be treated;
    said electrode means comprises a target electrode fixed to an undersurface of said metal cap at a center portion thereof;
    said bias electrode is supported by a supporting rod hanging from said metal cap placed below said target electrode;
    said exhaust hole and gas introducing hole are respectively provided at predetermined portions of said metal cap; and
    said target and bias electrodes, respectively, are provided with terminals on an upper surface of said metal cap.

8. The apparatus according to claim 7, wherein said target electrode further comprises an impedance matching box which is provided on the upper surface of said metal cap and which includes said terminal therein.

9. The apparatus according to claim 6, wherein
    said fixing member comprises a plurality of stands for fixing said casing to said body to be treated, thereby coating the bottom surface of the large or immovable body.

10. The apparatus according to claim 1, wherein said sealing member is composed of a soft material such as rubber and silicone resin in paste form.

11. The apparatus according to claim 1 wherein said power source comprises power supply means for applying a voltage between said bias electrode and said surface to be treated before sputtering to cause a discharge therebetween, thereby cleaning said surface to be treated to increase the adhesive force of a coating thereon, and for then applying a voltage between said electrode means and said cleaned surface to cause a discharge therebetween for sputtering.

12. The apparatus according to claim 1 wherein said power source comprises power supply means for applying a predetermined voltage between said electrode means and said surface to be treated and between said bias electrode and said surface to be treated.

13. The apparatus according to claim 12 wherein said power supply means further applies a voltage between said bias electrode and said surface to be treated before said sputtering to cause a discharge therebetween, thereby cleaning said surface to be treated.

* * * * *